(12) United States Patent
Buonodono

(10) Patent No.: US 9,916,966 B1
(45) Date of Patent: Mar. 13, 2018

(54) APPARATUS AND METHOD FOR MINIMIZING THERMAL DISTORTION IN ELECTRODES USED WITH ION SOURCES

(71) Applicant: Varian Semiconductor Equipment Associates, Inc., Gloucester, MA (US)

(72) Inventor: James P. Buonodono, Amesbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/415,944

(22) Filed: Jan. 26, 2017

(51) Int. Cl.
   *H01J 37/00* (2006.01)
   *H01J 37/24* (2006.01)
   *H01J 37/08* (2006.01)

(52) U.S. Cl.
   CPC ............ *H01J 37/242* (2013.01); *H01J 37/08* (2013.01)

(58) Field of Classification Search
   CPC ................................ H01J 37/242; H01J 37/08
   USPC ........................ 250/396 R, 493.1, 423 R–427
   See application file for complete search history.

(56) References Cited

U.S. PATENT DOCUMENTS

| | | | |
|---|---|---|---|
| 9,530,615 B2* | 12/2016 | Kurunczi | B08B 7/0021 |
| 2007/0210260 A1* | 9/2007 | Horsky | C23C 14/48 |
| | | | 250/424 |
| 2010/0107980 A1* | 5/2010 | Horsky | C23C 14/48 |
| | | | 118/723 E |

* cited by examiner

*Primary Examiner* — Michael Maskell
(74) *Attorney, Agent, or Firm* — Nields, Lemack & Frame, LLC

(57) ABSTRACT

An apparatus for improving the uniformity of an ion beam is disclosed. The apparatus includes a heating element to heat an edge of the suppression electrode that is located furthest from the suppression aperture. In operation, the edge of the suppression electrode nearest to the suppression electrode may be heated by the ion beam. This heat may cause the suppression electrode to distort, affecting the uniformity of the ion beam. By heating the distal edge of the suppression electrode, the thermal distortion of the suppression electrode can be controlled. In other embodiments, the distal edge of the suppression electrode is heated to create a more uniform ion beam. By monitoring the uniformity of the ion beam downstream from the suppression electrode, such as by use of a beam uniformity profiler, a controller can adjust the heat applied to the distal edge to achieve the desired ion beam uniformity.

20 Claims, 5 Drawing Sheets

APPARATUS AND METHOD FOR MINIMIZING THERMAL DISTORTION IN ELECTRODES USED WITH ION SOURCES

FIELD

Embodiments relate to an apparatus and method for minimizing the thermal distortion of electrodes proximate an ion source, and more particularly, an apparatus for heating portions of the electrodes to compensate for heat generated by the extracted ion beam.

BACKGROUND

Ions are used in a plurality of semiconductor processes, such as implantation, amorphization, deposition and etching processes. These ions may be created within an ion source chamber and extracted through an extraction aperture in the ion source chamber.

The ions may be attracted through the extraction aperture by an optics system disposed outside and proximate the ion source chamber. Typical optic elements for an ion source include an extraction electrode, which may be the wall of the ion source chamber that includes the extraction aperture. Other optic elements include a suppression electrode and a ground electrode. The suppression electrode may be electrically biased to attract the ions created within the ion source chamber. For example, the suppression electrode may be negatively biased to attract positive ions from within the ion source chamber. In certain embodiments, there could be up to five electrodes with the addition of a focusing lens and an additional ground electrode.

The electrodes may each be a single electrically conductive component with an aperture disposed therein. Alternatively, each electrode may be comprised of two components that are spaced apart so as to create an aperture between the two components. In both embodiments, the ion beam passes through the aperture in each electrode. The portion of the electrode disposed proximate the aperture may be referred to as the optical edge. The portion of the electrode furthest from the aperture may be referred to as the distal edge.

It is not uncommon for some portion of the ion beam extracted from the ion source chamber to strike the suppression electrode, causing it to heat up along the optical edge. However, not all portions of the suppression electrode are equally impacted by the extracted ions. Consequently, the suppression electrode may be heated unevenly by these extracted ions.

In certain embodiments, the uneven heating of the suppression electrode may be problematic. This problem may be exacerbated as the length of the suppression electrode increases. Therefore, it would be beneficial if there were an apparatus and method to compensate or control the thermal distortion caused by this uneven heating.

SUMMARY

An apparatus for improving the uniformity of an ion beam is disclosed. The apparatus includes a heating element to heat an edge of the suppression electrode that is located furthest from the suppression aperture. In operation, the edge of the suppression electrode nearest to the suppression electrode may be heated by the ion beam. This heat may cause the suppression electrode to distort, affecting the uniformity of the ion beam. By heating the distal edge of the suppression electrode, the thermal distortion of the suppression electrode can be controlled. In other embodiments, the distal edge of the suppression electrode is heated to create a more uniform ion beam. By monitoring the uniformity of the ion beam downstream from the suppression electrode, such as by use of a beam uniformity profiler, a controller can adjust the heat applied to the distal edge to achieve the desired ion beam uniformity.

According to one embodiment, an apparatus for controlling thermal distortion of a suppression electrode is disclosed. The apparatus comprises an ion source having a plurality of chamber walls defining an ion source chamber and having an extraction aperture; a suppression electrode disposed outside the ion source chamber and having a suppression aperture, an optical edge disposed proximate the suppression aperture and a distal edge disposed furthest from the suppression aperture; a heating element to heat the distal edge of the suppression electrode; a heater power supply to provide power to the heating element; and a controller in communication with the heater power supply so as to control a temperature of the distal edge of the suppression electrode. In certain embodiments, the controller utilizes open loop control to control the temperature of the distal edge of the suppression electrode. In certain embodiments, the heating element is disposed on the suppression electrode. In other embodiments, the heating element is not in direct contact with the suppression electrode. In some embodiments, the heating element comprises LEDs or heat lamps. In certain embodiments, the apparatus comprises thermal sensors in communication with the controller to measure a temperature of at least a portion of the suppression electrode. In some embodiments, the thermal sensor may be used to measure a temperature of the optical edge and the controller controls the temperature of the distal edge based on the temperature of the optical edge. In some embodiments, the thermal sensors are used to measure a temperature of the optical edge and the distal edge, and controller controls the temperature of the distal edge based on a temperature difference of the optical edge and the distal edge. In certain embodiments, the thermal sensor are disposed on the suppression electrode. In other embodiments, the thermal sensors are not in direct contact with the suppression electrode.

According to another embodiment, an apparatus for controlling uniformity of an ion beam is disclosed. The apparatus comprises an ion source having a plurality of chamber walls defining an ion source chamber and having an extraction aperture through which an ion beam is extracted; a suppression electrode disposed outside the ion source chamber and having a suppression aperture, an optical edge disposed proximate the suppression aperture and a distal edge disposed furthest from the suppression aperture; a heating element to heat the distal edge of the suppression electrode; a heater power supply to provide power to the heating element; a beam uniformity profiler, disposed downstream from the suppression electrode; and a controller in communication with the heater power supply, wherein the controller utilizes information from the beam uniformity profiler to control uniformity of the ion beam by heating the distal edge of the suppression electrode. In certain embodiments, the beam uniformity profiler comprises a plurality of current or charge collectors arranged so as to determine the current or charge of the ion beam as a function of X-Y location.

According to another embodiment, an apparatus for controlling uniformity of an ion beam is disclosed. The apparatus comprises a suppression electrode disposed outside an ion source chamber and having a suppression aperture, an optical edge disposed proximate the suppression aperture and a distal edge disposed furthest from the suppression aperture, such that ions from the ion source pass through the suppression aperture; a heating element to heat the distal edge of the suppression electrode; and a heater power supply to provide power to the heating element. In certain embodiments, the heating element comprises a resistive element. In other embodiment, the heating element comprises a LED or heat lamp.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
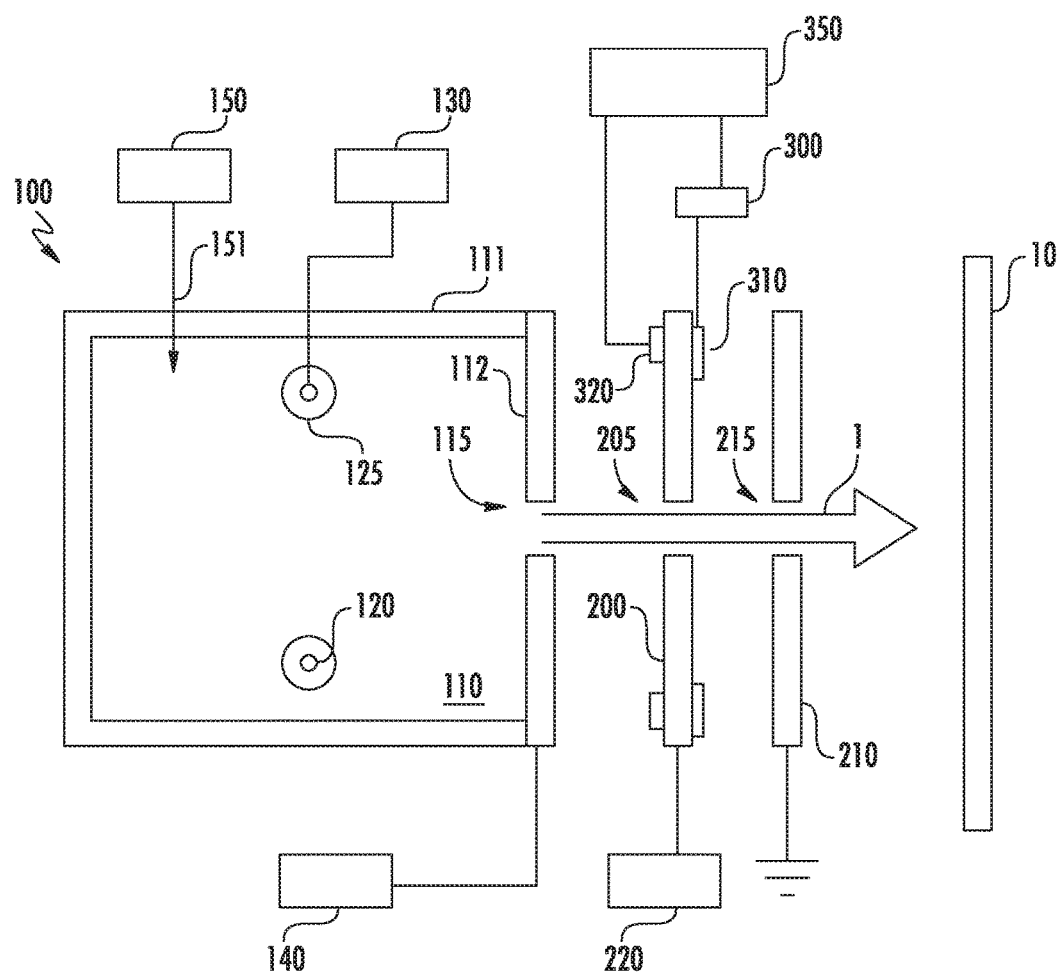
FIG. 1 shows an apparatus for controlling thermal distortion according to one embodiment.

FIG. 1 shows a first embodiment of an apparatus that may be used to control thermal distortion of the suppression electrode 200. In this embodiment, an RF ion source 100 is illustrated. The RF ion source 100 comprises a plurality of chamber walls 111 defining an ion source chamber 110. An RF antenna 120 may be disposed within the ion source chamber 110. The RF antenna 120 may comprise an electrically conductive material, such as copper. The RF antenna 120 may be encased in a hollow tube 125, which may be made of a dielectric material, such as quartz. An RF power supply 130 is in electrical communication with the RF antenna 120. The RF power supply 130 may supply an RF voltage to the RF antenna 120. The power supplied by the RF power supply 130 may be between 0.5 and 60 kW and may be any suitable frequency, such as between 5 and 15 MHz. Further, the power supplied by the RF power supply 130 may be pulsed.

While the figures show the RF antenna 120 encased in a hollow tube 125 within the ion source chamber 110, other embodiments are also possible. For example, one of the chamber walls 111 may be made of a dielectric material and the RF antenna 120 may be disposed outside the ion source chamber 110, proximate the dielectric wall. In yet other embodiments, the plasma is generated in a different manner, such as by a Bernas ion source or an indirectly heated cathode (IHC). The manner in which the plasma is generated is not limited by this disclosure.

In certain embodiments, the chamber walls 111 may be electrically conductive, and may be constructed of metal. In certain embodiments, these chamber walls 111 may be electrically biased. In certain embodiments, the chamber walls 111 may be grounded. In other embodiments, the chamber walls 111 may be biased at a voltage by bias power supply 140. In certain embodiments, the bias voltage may be a constant (DC) voltage. In other embodiments, the bias voltage may be pulsed. The bias voltage applied to the chamber walls 111 establishes the potential of the plasma within the ion source chamber 110. The difference between the electrical potential of the plasma and the electrical potential of the suppression electrode 200 may determine the energy that the extracted ions possess.

One chamber wall, referred to as the extraction electrode 112, includes an extraction aperture 115. The extraction aperture 115 may be an opening through which the ions generated in the ion source chamber 110 are extracted and directed toward a workpiece 10. The extraction aperture 115 may be any suitable shape. In certain embodiments, the extraction aperture 115 may be oval or rectangular shaped, having one dimension, referred to as the length, which may be much larger than the second dimension, referred to as the height. In certain embodiments, the length of the extraction aperture 115 may be as large as two meters or more. In certain embodiments, only the extraction electrode 112 is electrically conductive and in communication with the bias power supply 140. The remaining chamber walls 111 may be made of a dielectric material. In other embodiments, the extraction electrode 112 and all of the chamber walls 111 may be electrically conductive. The bias power supply 140 may bias the extraction electrode 112 at a voltage of between 1 kV and 5 kV, although other voltages are also within the scope of the disclosure.

Disposed outside and proximate the extraction aperture 115 is a suppression electrode 200. The suppression electrode 200 may be a single electrically conductive component with a suppression aperture 205 disposed therein. Alternatively, the suppression electrode 200 may be comprised of two electrically conductive components that are spaced apart so as to create the suppression aperture 205 between the two components. The suppression electrode 200 may be a metal, such as titanium. The suppression electrode 200 may be electrically biased using a suppression power supply 220. The suppression electrode 200 may be biased so as to be more negative than the extraction electrode 112. In certain embodiments, the suppression electrode 200 is negatively biased by the suppression power supply 220, such as at a voltage of between −3 kV and −15 kV.

Disposed proximate the suppression electrode 200 may be a ground electrode 210. Like the suppression electrode 200, the ground electrode 210 may be a single electrically conductive component with a ground aperture 215 disposed therein, or may be comprised of two components that are spaced apart so as to create the ground aperture 215 between the two components. The ground electrode 210 may be electrically connected to ground. Of course, in other embodiments, the ground electrode 210 may be biased using a separate power supply. The extraction aperture 115, the suppression aperture 205 and the ground aperture 215 are all aligned.

The workpiece 10 is located downstream from the ground electrode 210. In certain embodiments, the workpiece 10 is located immediately following the ground electrode 210, as shown in FIGS. 1, 3, 4 and 5. In other embodiments, additional components, such as mass analyzers, collimating magnets, acceleration and deceleration stages, may be disposed between the ground electrode 210 and the workpiece 10.

In operation, feed gas from a gas storage container 150 is introduced to the ion source chamber 110 through a gas inlet 151. The RF antenna 120 is energized by the RF power supply 130. This energy excites the feed gas, causing the creation of a plasma. Ions in that plasma are typically positively charged. Because the suppression electrode 200 is more negatively biased than the extraction electrode 112, the ions exit through the extraction aperture 115 in the form of an ion beam 1. The ion beam 1 passes through the extraction aperture 115, the suppression aperture 205 and the ground aperture 215 and travels toward the workpiece 10.

The portion of the suppression electrode 200 disposed proximate the suppression aperture 205 in the height dimension may be referred to as the optical edge. The portion of the suppression electrode 200 furthest from the suppression aperture 205 in the height dimension may be referred to as the distal edge.

Ions from the ion beam 1 that are extracted through the extraction aperture 115 may strike the suppression electrode 200, typically proximate the optical edge. As the optical edge of the suppression electrode 200 heats due the bombardment of ions, the length of the suppression electrode 200 may increase. This increase in length may be determined based on the coefficient of thermal expansion of the material used to create the suppression electrode 200. However, the increase in length may not be equal over the entirety of the suppression electrode 200. For example, due to the thermal resistivity of the material used to construct the suppression electrode 200, the distal edge of the suppression electrode 200, which is not being directly struck with ions, may not be as hot as the optical edge of the suppression electrode 200. This causes the optical edge of the suppression electrode 200 to expand more than the distal edge, causing the suppression electrode 200 to warp or distort.

Figure 2A:
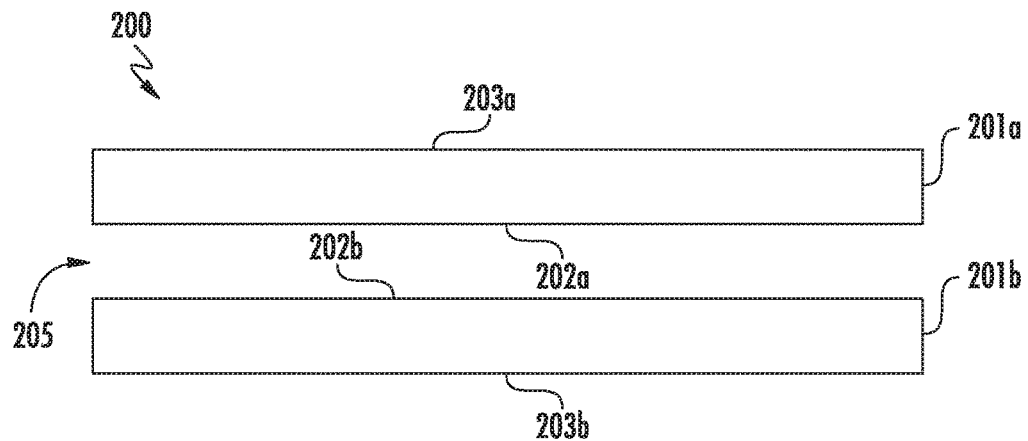
FIG. 2A shows the suppression electrode prior to extraction and FIG. 2B shows the suppression electrode after being impacted by the extracted ion beam.

FIG. 2A shows a suppression electrode 200 which is made up of two components 201a, 201b. The space between the two components 201a, 201b defines the suppression aperture 205. Before the ion beam 1 is extracted, these two components 201a, 201b are not distorted, such that the optical edges 202a, 202b of the two components 201a, 201b, respectively, are parallel to one another.

Figure 2B:
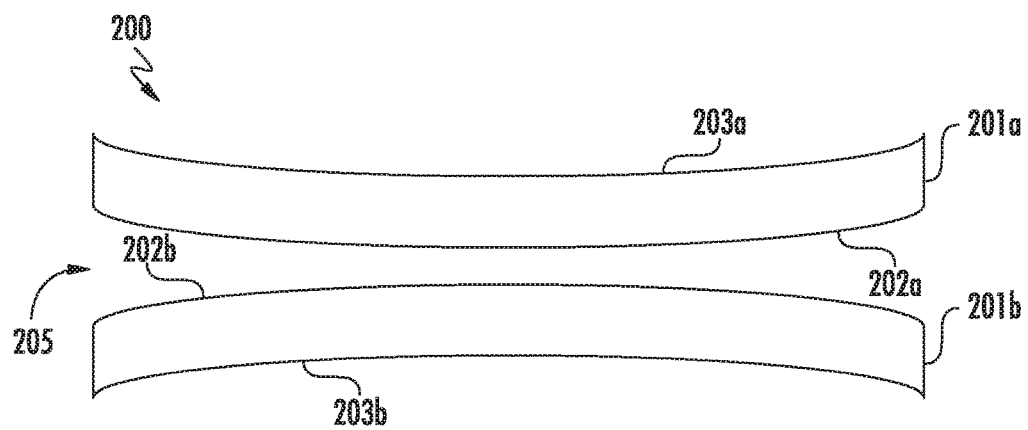

As the ion beam 1 is extracted, ions strike the optical edges 202a, 202b of the components 201a, 201b, which causes these optical edges to expand. However, as described above, the distal edges 203a, 203b of the components 201a, 201b may not expand to the same extent due to the difference in temperature. Consequently, the suppression electrode 200 becomes distorted, as shown in FIG. 2B. This distortion is exaggerated for purposes of illustration. In this figure, the optical edges 202a, 202b have expanded causing each component 201a, 201b to warp. In certain embodiments, the middle portion of each optical edge 202a, 202b in the length dimension bows toward the other optical edge 202a, 202b. This causes the shape of the suppression aperture 205 to become irregular such that the suppression aperture 205 may be narrower in the middle portion than at the outer portions in the length dimension. Thus, the beam current of the ion beam 1 becomes non-uniform as a function of length, which may be problematic. Furthermore, as the length of the suppression electrode 200 increases, the distortion caused by thermal expansion may be exacerbated.

To compensate for this unwanted distortion, heating elements 310 may be used to heat the distal edges of the suppression electrode 200.

FIG. 1 shows one embodiment, in which the heating elements 310 may be resistive elements. These resistive elements are disposed on the distal edges of the suppression electrode 200. These resistive elements may be in communication with a heater power supply 300. While resistive elements are one type of heating element 310, the disclosure is not limited to this embodiment. Any device which can supply heat to the distal edge of the suppression electrode 200 may be utilized.

The heater power supply 300 may also be in communication with a controller 350. The controller 350 may include a processing unit and a storage element. The storage element may be any suitable non-transitory memory device, such as semiconductor memory (i.e. RAM, ROM, EEPROM, FLASH RAM, DRAM, etc.), magnetic memory (i.e. disk drives), or optical memory (i.e. CD ROMs). The storage element may be used to contain the instructions, which when executed by the processing unit in the controller 350, allow the heating element 310 to control the thermal distortion of the suppression electrode 200.

In certain embodiments, one heating element 310 is disposed on the suppression electrode 200. In other embodiments, a plurality of heating elements 310 may be disposed on the suppression electrode 200. In embodiments where multiple heating elements 310 are utilized, these heating elements 310 may be independently controlled by the controller 350, such as through the use of multiple heater power supplies, or may be commonly controlled. For example, in certain embodiments, the heating elements 310 located near the center of the suppression electrode 200 in the length dimension may be heated to a greater extent than heating elements 310 disposed near the outer edge in the length dimension.

The controller 350 may utilize a variety of techniques to control the heating elements 310. In a first embodiment, empirical data is collected which maps the temperature of the suppression electrode 200 as a function of time. For example, the data may be used to create a table describing the temperature of the optical edge as a function of time. Alternatively, the data may be used to create a table describing the temperature difference between the optical edge and the distal edge as a function of time. In certain embodiments, the data may be used to create a table defining the amount of power to supply to the heating elements 310 as a function of time. This information may then be stored in the storage element of the controller 350. In this embodiment, the controller 350 provides instructions to the heater power supply 300 to control the power applied to the heating elements 310. The instructions from the controller 350 to the heater power supply 300 may vary as a function of time. Thus, this embodiment utilizes open loop control to control the thermal distortion of the suppression electrode 200.

In another embodiment, thermal sensors 320 may be disposed on or near the suppression electrode 200. In certain embodiments, the thermal sensors 320 are disposed near both the optical edge and the distal edge. In other embodiments, the thermal sensors 320 are only disposed near one of these two edges. These thermal sensors 320 may be thermocouples, resistance temperature detectors (RTDs) or other types of thermal sensors.

Figure 3:
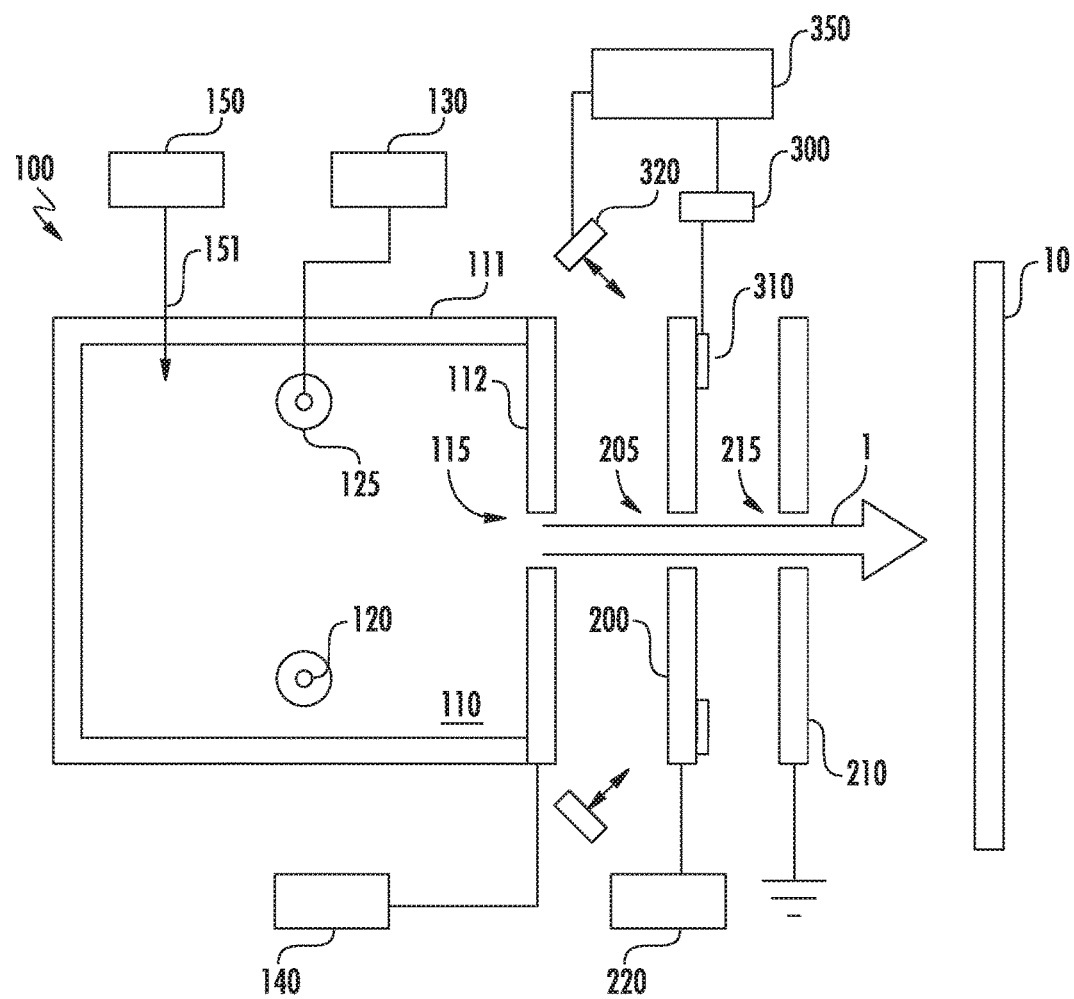
FIG. 3 shows an apparatus for controlling thermal distortion according to another embodiment.

In another embodiment, shown in FIG. 3, the thermal sensors 320 may not be disposed on the suppression electrode 200. For example, the thermal sensor 320 may be an infrared camera, which may be disposed in a location such that the temperature of the suppression electrode 200 may be measured remotely. The infrared camera may be used interchangeably with the RTDs or thermocouples in any of these embodiments.

In all of these embodiments, the thermal sensors 320 may be in communication with the controller 350, so that the controller 350 obtains information about the actual temperature of the suppression electrode 200. In some embodiments, the controller 350 utilizes the difference between the temperature of the optical edge and the temperature of the distal edge to determine the power to be provided to the heating elements 310. In other embodiments, the controller 350 uses the actual temperatures of the optical edge and the distal edge to determine the power to be provided to the heating elements 310. In certain embodiments, the controller 350 uses actual temperature data for one of the optical edge and the distal edge to determine the power to provide to the heating elements 310.

The controller 350 then uses this actual temperature data to determine the power that is to be applied to the heating elements 310. The controller 350 may provide instructions to the heater power supply 300 continuously based on continuous monitoring of the temperature of the suppression electrode 200. In other embodiments, the controller 350 updates the instructions to the heater power supply 300 on a periodic basis, such as once per minute or any other suitable interval. Further, in certain embodiments, the suppression electrode 200 may reach a steady state condition after a certain number of minutes and updates from the controller 350 may no longer be provided after this occurs.

Figure 4:
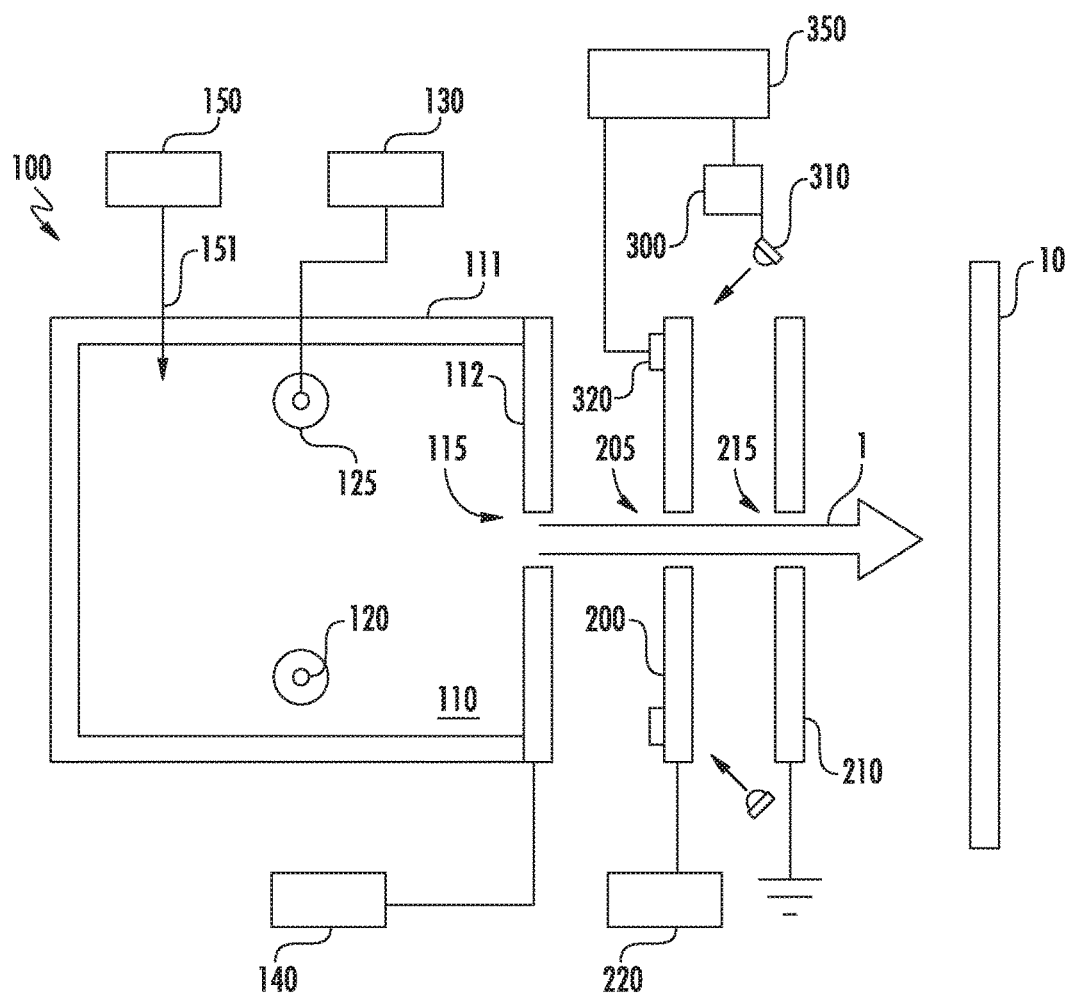
FIG. 4 shows an apparatus for controlling thermal distortion according to a third embodiment.

FIG. 4 shows another embodiment in which the heating elements 310 are not disposed on the suppression electrode 200. For example, the heating elements 310 may be LEDs or heat lamps. In this embodiment, the heating elements 310 are disposed proximate the suppression electrode 200 so that the heat from the heating elements 310 targets and reaches the distal edges of the suppression electrode 200. The controller 350 may be in communication with the heater power supply 300 to provide the power level that is to be provided to the LEDs or heat lamps. These LEDs or heat lamps may be used in place of resistive elements in any of these embodiments. For example, these LEDs or heat lamps may be used in an open loop configuration. Alternatively, as shown in FIG. 4, these LEDs or heat lamps may be used with thermal sensors 320 disposed on the suppression electrode 200. Additionally, these LEDs or heat lamps may be used with thermal sensors that are not disposed on the suppression electrode 200, such as those shown in FIG. 3. Thus, the LEDs or heat lamps may be used interchangeably with the resistive elements shown in FIGS. 1 and 3.

Thus, FIGS. 1, 3 and 4 show embodiments where a thermal sensor 320, which may be in direct contact with the suppression electrode 200 or disposed proximate to the suppression electrode 200, is used to measure the temperature of one or more edges of the suppression electrode 200. Information from these thermal sensors 320 is then used by the controller 350 to determine the amount of power to apply to the heating elements 310. Like the thermal sensors 320, the heating elements 310 may be in direct contact with the suppression electrode 200 or disposed proximate to the suppression electrode 200. Thus, the thermal sensors 320, the controller 350, the heater power supply 300 and the heating elements 310 form a closed control loop that may be used to control the thermal distortion of the suppression electrode 200.

The embodiments in these figures show closed loop control of the suppression electrode based on measured temperatures of one or more edges of the suppression electrode 200. However, closed loop control may be achieved in other manners as well.

Figure 5:
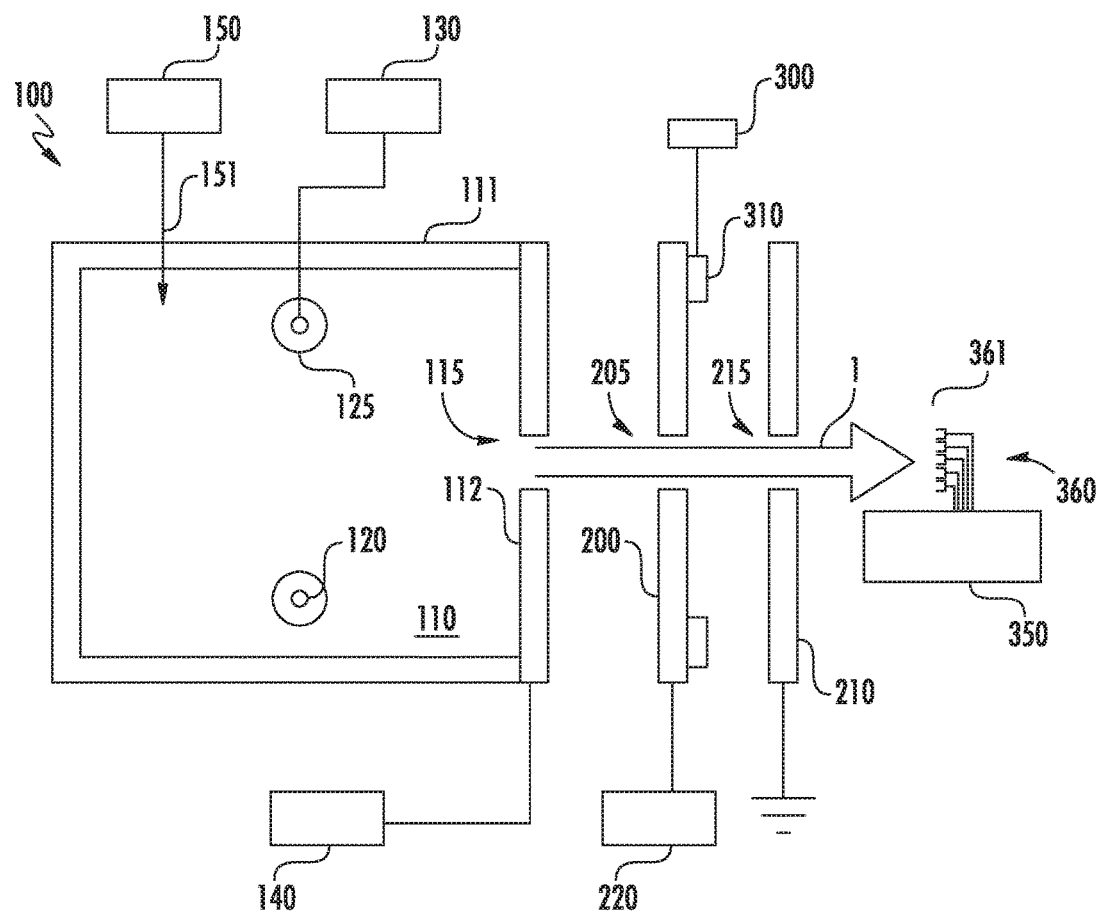
FIG. 5 shows an apparatus for controlling thermal distortion according to a fourth embodiment.

FIG. 5 shows another embodiment. In this embodiment, thermal sensors 320 are not used. Rather, the controller 350 uses information regarding the uniformity of the ion beam 1 to control the heating elements 310. For example, a beam uniformity profiler 360, which may comprise a plurality of current or charge collectors 361, may be disposed near the station where the workpiece 10 is typically provided. In certain embodiments, the beam uniformity profiler may extend across the entire length of the ion beam 1. In other embodiments, the current or charge collectors 361 may scan across the length of the ion beam 1.

At certain times, the workpiece 10 may be removed so that the ion beam 1 strikes the beam uniformity profiler 360. The current or charge may be collected as a function of X-Y position of the ion beam. Thus, if there is no thermal distortion of the suppression electrode 200, the current or charge may be uniform across the length and height of the ion beam 1. However, as the suppression electrode 200 becomes distorted, the current or charge may cease to be uniform. For example, use of the suppression electrode 200 shown in FIG. 2B may result in greater current or charge at the ends of the ion beam 1 and reduced current or charge at the center of the ion beam 1.

The current or charge information collected by the beam uniformity profiler 360 may be used by the controller 350 to determine the amount of power that is to be applied to the heating elements 310. Thus, FIG. 5 uses a closed control loop that is made up of the beam uniformity profiler 360, the controller 350, the heater power supply 300 and the heating elements 310. In this embodiment, thermal distortion is monitored by observing the ion beam 1 downstream from the suppression electrode 200. Thus, this embodiment monitors the ion beam 1 rather than attempting to equalize the temperature of the optical and distal edges of the suppression electrode 200, as was done in FIGS. 1, 3 and 4.

To utilize the beam uniformity profiler 360, the workpiece 10 is removed from the apparatus. Thus, when the uniformity of the ion beam 1 is being measured, workpieces 10 cannot be processed, resulting in a decrease in efficiency and throughput. Thus, in this embodiment, the beam uniformity profiler 360 may only be utilized sparingly, such as at regular intervals. For example, the beam uniformity profiler 360 may be utilized after every N workpieces have been processed. In another embodiment, the beam uniformity profiler 360 may be utilized as fixed time intervals. In this way, the thermal distortion may be controlled while minimizing the decrease in throughput.

The present apparatus has many advantages. First, in one experiment, the amount of thermal distortion, determined by measuring deflection of the optical edge of the suppression electrode 200, was reduced over 85%. This reduction in thermal distortion improves ion beam uniformity. Thus, the heating of the suppression electrode 200 becomes another tuning mechanism to control ion beam uniformity.

The use of a beam uniformity profiler 360 as a means to provide input to the controller 350 may have other advantages. For example, in certain embodiments, the ion beam 1 extracted from the extraction aperture 115 may not be uniform in the length dimension. For example, the beam current may be greater in the center of the ion beam 1. Thus, in this embodiment, it may be beneficial to have a certain amount of thermal distortion to reduce the beam current in the center of the ion beam 1. Thus, the beam uniformity profiler 360, in conjunction with the heating elements 310 and the controller 350 can also be used to compensate for non-uniformities of the ion beam 1 caused by other components of the apparatus. This technique may also be used to compensate for non-uniformities introduced downstream from the suppression electrode 200. In certain embodiments, a plurality of independently controlled heating elements 310 may be utilized to exert finer control over the thermal distortion of the suppression electrode 200.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus for controlling thermal distortion of a suppression electrode, comprising:
    an ion source having a plurality of chamber walls defining an ion source chamber and having an extraction aperture;
    a suppression electrode disposed outside the ion source chamber and having a suppression aperture, an optical edge disposed proximate the suppression aperture and a distal edge disposed furthest from the suppression aperture;
    a heating element to heat the distal edge of the suppression electrode;
    a heater power supply to provide power to the heating element; and
    a controller in communication with the heater power supply so as to control a temperature of the distal edge of the suppression electrode to control thermal distortion of the suppression electrode.

2. The apparatus of claim 1, where the controller utilizes open loop control to control the temperature of the distal edge of the suppression electrode.

3. The apparatus of claim 1, wherein the heating element is disposed on the suppression electrode.

4. The apparatus of claim 1, wherein the heating element is not in direct contact with the suppression electrode.

5. The apparatus of claim 4, wherein the heating element comprises LEDs or heat lamps.

6. The apparatus of claim 1, further comprising thermal sensors in communication with the controller to measure a temperature of at least a portion of the suppression electrode.

7. The apparatus of claim 6, wherein the thermal sensors are used to measure a temperature of the optical edge and the controller controls the temperature of the distal edge based on the temperature of the optical edge.

8. The apparatus of claim 6, wherein the thermal sensors are used to measure a temperature of the optical edge and the distal edge, and controller controls the temperature of the distal edge based on a temperature difference of the optical edge and the distal edge.

9. The apparatus of claim 6, wherein the thermal sensors are disposed on the suppression electrode.

10. The apparatus of claim 6, wherein the thermal sensors are not in direct contact with the suppression electrode.

11. The apparatus of claim 10, wherein the thermal sensors comprise infrared cameras.

12. An apparatus for controlling uniformity of an ion beam, comprising:
    an ion source having a plurality of chamber walls defining an ion source chamber and having an extraction aperture through which an ion beam is extracted;
    a suppression electrode disposed outside the ion source chamber and having a suppression aperture, an optical edge disposed proximate the suppression aperture and a distal edge disposed furthest from the suppression aperture;
    a heating element to heat the distal edge of the suppression electrode;
    a heater power supply to provide power to the heating element;
    a beam uniformity profiler, disposed downstream from the suppression electrode; and
    a controller in communication with the heater power supply, wherein the controller utilizes information from the beam uniformity profiler to control uniformity of the ion beam by heating the distal edge of the suppression electrode.

13. The apparatus of claim 12, wherein the heating element is disposed on the suppression electrode.

14. The apparatus of claim 12, wherein the heating element is not in direct contact with the suppression electrode.

15. The apparatus of claim 14, wherein the heating element comprises LEDs or heat lamps.

16. The apparatus of claim 12, wherein the beam uniformity profiler comprises a plurality of current or charge collectors arranged so as to determine the current or charge of the ion beam as a function of X-Y location.

17. An apparatus for controlling uniformity of an ion beam, comprising:
    a suppression electrode disposed outside an ion source chamber and having a suppression aperture, an optical edge disposed proximate the suppression aperture and a distal edge disposed furthest from the suppression aperture, such that ions from the ion source pass through the suppression aperture;
    a heating element to heat the distal edge of the suppression electrode;
    a heater power supply to provide power to the heating element; and
    a controller in communication with the heater power supply, wherein the controller determines the power to be provided based on at least a temperature of the optical edge to control thermal distortion of the suppression electrode.

18. The apparatus of claim 17, further comprising thermal sensors to measure a temperature of the optical edge of the suppression electrode.

19. The apparatus of claim 17, wherein the heating element comprises a resistive element.

20. The apparatus of claim 17, wherein the heating element comprises a LED or heat lamp.

* * * * *